(12) United States Patent
Chen et al.

(10) Patent No.: US 9,362,420 B2
(45) Date of Patent: Jun. 7, 2016

(54) TRANSISTOR STRUCTURE FOR ELECTROSTATIC DISCHARGE PROTECTION

(71) Applicant: UNITED MICROELECTRONICS CORP., Hsin-Chu (TW)

(72) Inventors: Lu-An Chen, Hsinchu County (TW); Tien-Hao Tang, Hsinchu (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 200 days.

(21) Appl. No.: 13/746,296

(22) Filed: Jan. 21, 2013

(65) Prior Publication Data

US 2014/0203367 A1 Jul. 24, 2014

(51) Int. Cl.
*H01L 23/62* (2006.01)
*H01L 29/861* (2006.01)
*H01L 27/02* (2006.01)

(52) U.S. Cl.
CPC .......... *H01L 29/861* (2013.01); *H01L 27/0248* (2013.01); *H01L 27/0255* (2013.01); *H01L 27/0259* (2013.01); *H01L 27/0274* (2013.01)

(58) Field of Classification Search
CPC ............ H01L 27/0248; H01L 27/0251; H01L 27/0255; H01L 27/0259; H01L 27/0266; H01L 27/027; H01L 27/0274; H01L 27/0277; H01L 29/861
USPC .................................................. 257/355–360
See application file for complete search history.

(56) References Cited

U.S. PATENT DOCUMENTS

| 4,893,157 | A  | * | 1/1990 | Miyazawa et al. ............ 257/358 |
| 6,399,990 | B1 | * | 6/2002 | Brennan et al. ............... 257/355 |
| 2002/0014665 | A1 | * | 2/2002 | Lee et al. ...................... 257/355 |
| 2003/0197246 | A1 | * | 10/2003 | Ker et al. ...................... 257/565 |
| 2011/0248383 | A1 |   | 10/2011 | Ren |

* cited by examiner

*Primary Examiner* — Fernando L Toledo
*Assistant Examiner* — Aaron Gray
(74) *Attorney, Agent, or Firm* — Winston Hsu; Scott Margo

(57) ABSTRACT

The present invention discloses a transistor structure for electrostatic discharge protection. The structure includes a substrate, a doped well, a first doped region, a second doped region and a third doped region. The doped well is disposed in the substrate and has a first conductive type. The first doped region is disposed in the substrate, encompassed by the doped well and has the first conductive type. The second doped region is disposed in the substrate, encompassed by the doped well and has a second conductive type. The third doped region is disposed in the substrate, encompassed by the doped well and has the second conductive type. A gap is disposed between the first doped region and the second doped region.

14 Claims, 9 Drawing Sheets

TRANSISTOR STRUCTURE FOR ELECTROSTATIC DISCHARGE PROTECTION

BACKGROUND OF THE INVENTION

1. Field of the Invention

The present invention relates to a transistor structure, and more particularly, to a transistor structure for electrostatic discharge protection.

2. Description of the Prior Art

With the continued miniaturization of integrated circuit (IC) devices, the current trend is to produce integrated circuits having shallower junction depths, thinner gate oxides, lightly-doped drain (LDD) structures, shallow trench isolation (STI) structures, and self-aligned silicide (salicide) processes, all of which are used in advanced sub-quarter-micron CMOS technologies. All of these processes cause the related CMOS IC products to become more susceptible to electrostatic discharge (ESD) damage. Therefore, ESD protection circuits are built onto the chip to protect the devices and circuits of the IC against ESD damage.

Please refer to FIG. 1, which shows a schematic diagram of the electrical circuits having an ESD protection unit. In generally, the main circuit 104 can provide various kinds of functions and can be triggered by supplying signals from the input pad 100. However, in some situation, when an ESD current is formed by a contact between a human body and the contact pad 100 for example, the large ESD current will damage the main circuit 104. Thereafter, an ESD protection device 104 is usually provided in the IC. As long as the ESD current is applied, the ESD protection device 104 is turned on to let the ESD current pass through and further to a grounded site Vss, so the current would not damage the main circuit. 104.

However, current ESD protection device usually has a high triggering voltage and is turned on at a relatively high voltage. It makes the reaction time of the ESD protection device too long and thus reduces the performance of the device.

SUMMARY OF THE INVENTION

In order to solve the above-mentioned problem, the present invention therefore provides a transistor for ESD protection, which has a relatively low triggering voltage.

According to one embodiment of the present invention, the present invention discloses a transistor structure for electrostatic discharge protection. The structure includes a substrate, a doped well, a first doped region, a second doped region and a third doped region. The doped well is disposed in the substrate and has a first conductive type. The first doped region is disposed in the substrate, encompassed by the doped well and has the first conductive type. The second doped region is disposed in the substrate, encompassed by the doped well and has a second conductive type. The third doped region is disposed in the substrate, encompassed by the doped well and has the second conductive type. A gap is disposed between the first doped region and the second doped region.

The transistor structure set forth in the present invention has a parasitic diode, which is able to lower the triggering voltage of the transistor, thereby upgrading the sensitivity of the transistor for ESD protection.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be made in detail. The preferred embodiments of the present invention are illustrated in the accompanying drawings with numbered elements.

Figure 1:
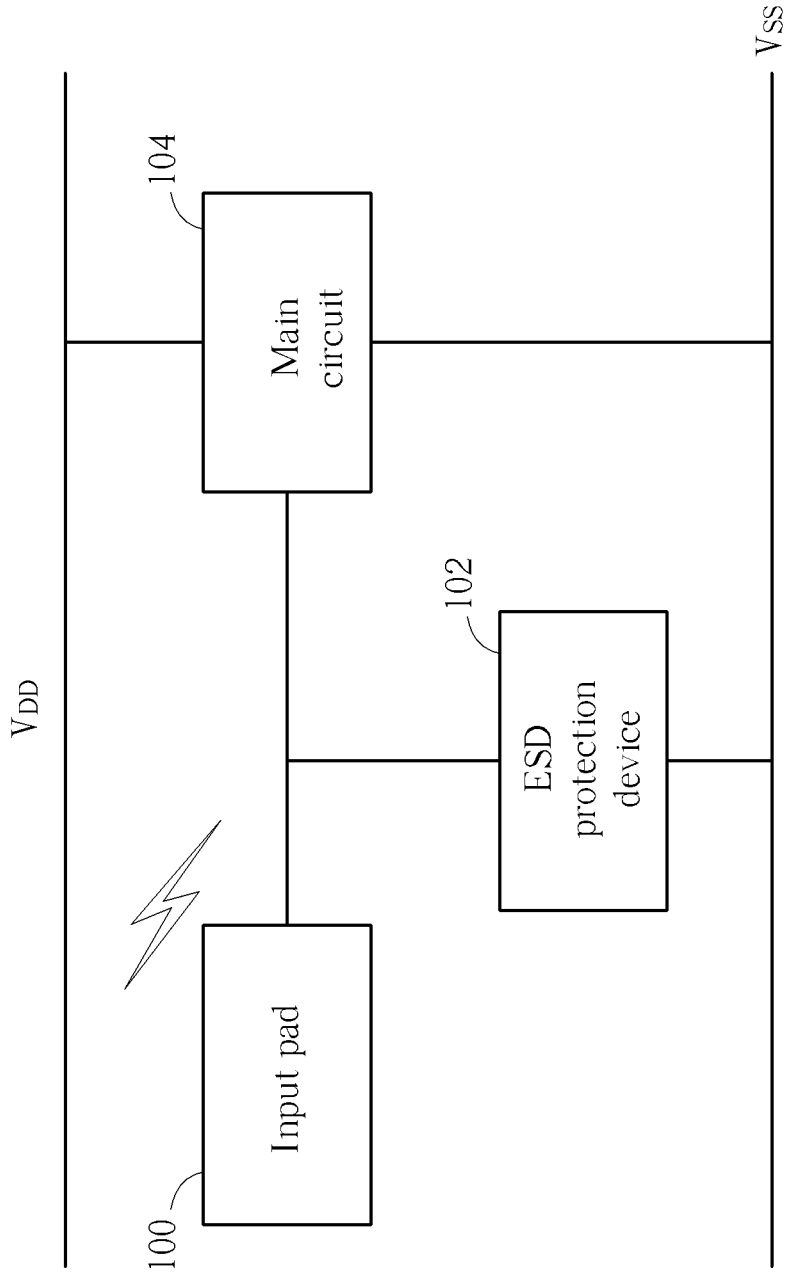
FIG. 1 shows a schematic diagram of a conventional electrical circuit having an ESD protection unit.
Figure 2:
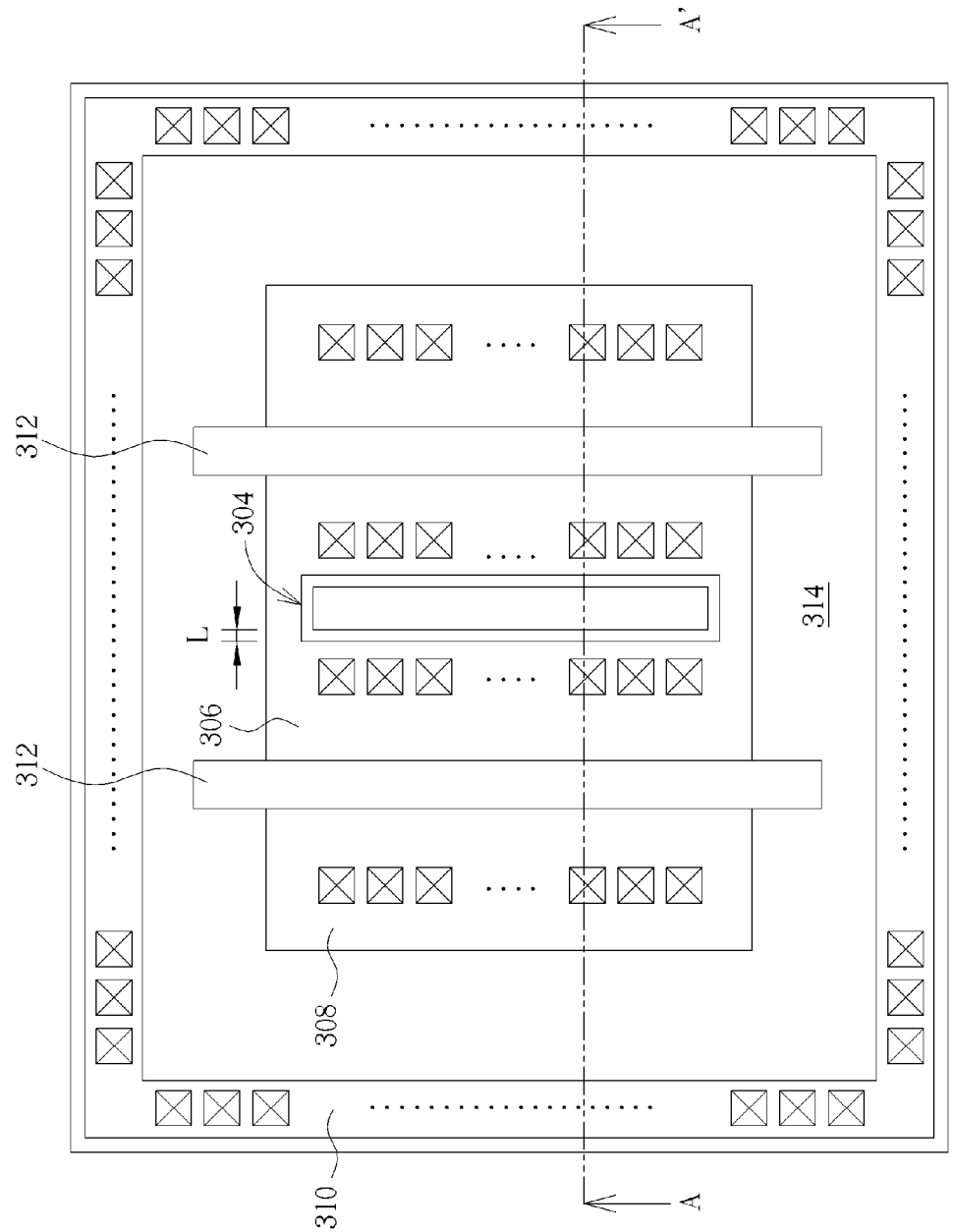
FIG. 2 to FIG. 4 show schematic diagrams of the transistor structure for ESD protection according to the first embodiment of the present invention.
Figure 3:
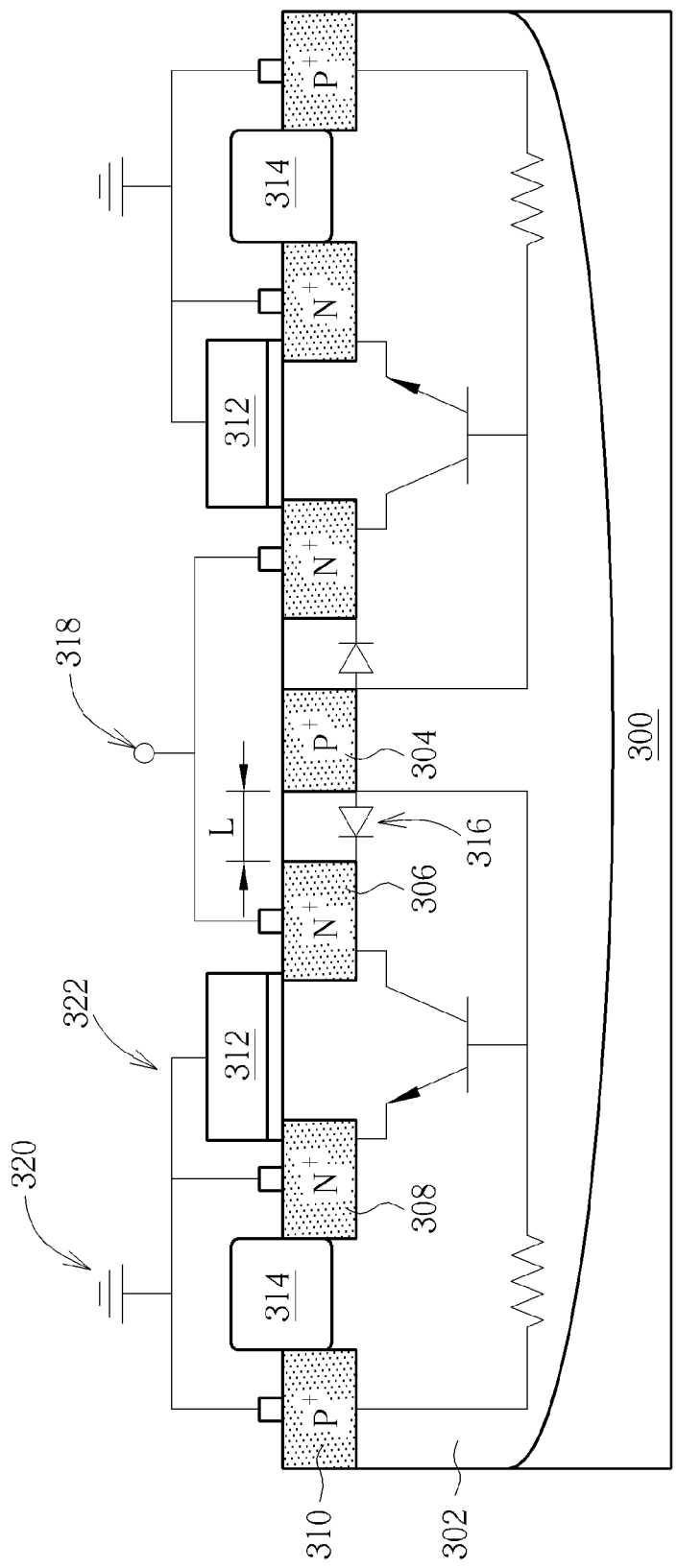
Figure 4:
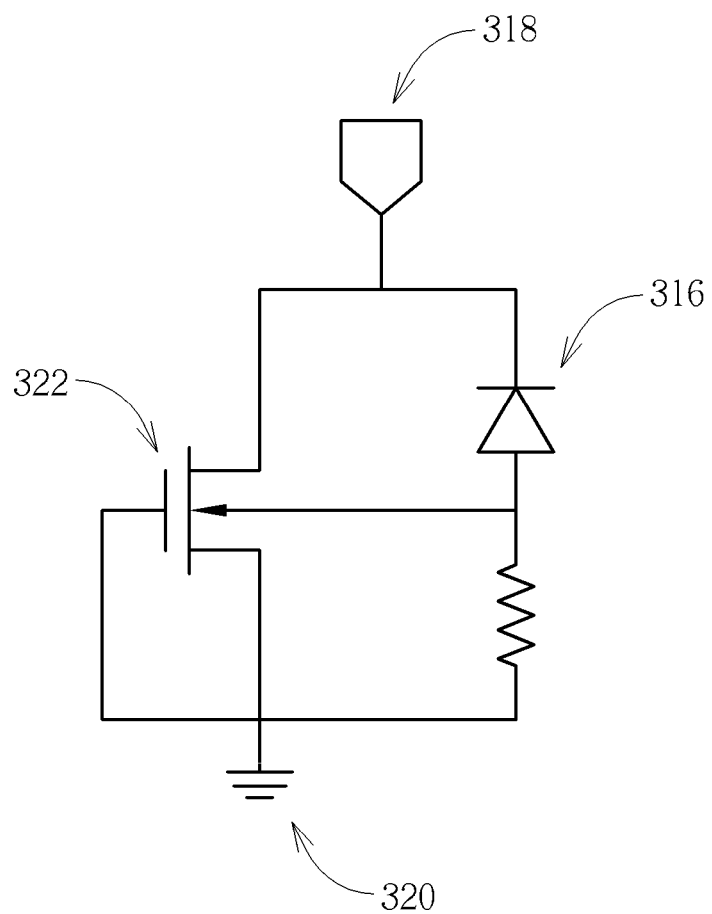

Please refer to FIG. 2 to FIG. 4, which show schematic diagrams of the transistor structure for ESD protection according to the first embodiment of the present invention, wherein FIG. 3 is a cross sectional view taken along line AA' in FIG. 2, and FIG. 4 is an equivalent circuit of the transistor structure in the present embodiment. As shown in FIG. 2 and FIG. 3, the transistor structure for ESD protection in the present invention includes a substrate 300, a doped well 302, a first doped region 304, a second doped region 306, a third doped region 308, and a fourth doped region 310. The substrate 300 can be a silicon substrate, an epitaxial silicon substrate, a silicon-germanium substrate, a silicon carbide substrate or a silicon-on-insulator (SOI) substrate, but is not limited thereto. The doped well 302 is disposed in the substrate 300 and has a first conductive type such as P type. Preferably, the doped well 302 completely surrounds the first doped region 304, the second doped region 306, the third doping region 308, and the fourth doped region 310. That is, the first doped region 304, and the second doped region 306, the third doped region 308 and the fourth doped region 310 preferably do not directly contact the substrate 300.

The first doped region 304 preferably has the first conductive type such as P type; the second doped region 306 preferably has a second conductive type such as N type; the third doped region 308 preferably has the second conductive type such as N type; the fourth doped region 310 preferably has the first conductivity type such as P type. In one embodiment, the dopant concentration of the first doped region 304 is substantially equal to that of the fourth doped region 310, and both of which are greater than that of the doped well 302. In another embodiment, the second doped region 306 and the third doped region 308 have substantially the same dopant concentration.

As shown from topview FIG. 2, the first doped region 304 is completely surrounded by the second doped region 306, and a gap L is disposed therebetween. In other words, the doped well 302 with a width L is disposed between the first doped region 304 and the second doped region 308, so the first doped region 304 and the second doped region 306 do not directly contact each other. A gate 312 including poly-silicon or metal is disposed above the doped well 302 between the second doped region 306 and the third doped region 308. The second doped region 306 and the third doped region 308 are separated by the gate 312. An isolation structure 314 surrounds the third doped region 308 and encompasses the first doped region 304, the second doped region 306 and the third doped region 308. The fourth doped region 310 is located outside of the isolation structure 314 and encompasses the isolation structure 314. As shown in FIG. 3, a high voltage power site 318 electrically connects the second doped region 306, while a low voltage power site 320 electrically connects the gate 312, the third doped region 308 and the fourth doped region 310. The doped well 302, the second doped region 306, the gate 312, and the third doped region 308 together form a "gate grounded NMOS (ggNMOS) 322", wherein the second doped region 306 serves as a drain, the third doped region 308 servers as a source and the doped well 302 serves as a body. In one embodiment, these doped regions, for example, are electrically connected to the high voltage power site 318 or the low voltage power site 320 through a plurality of contact plugs. It is worth noting that in the present invention, the first doped region 304 is floating and is not electrically connected to any input/output signals. Specifically, there is no contact plug connecting the first doped region 304. In this manner, the first doped region 304, the second doped region 306, and the doped well 302 therebetween together form a "parasitic diode 316" structure. Please also refer to the equivalent circuit shown in FIG. 4. When a large ESD current is supplied to the high voltage power site 318, the current will turn on the ggNMOS 322. The ESD current subsequently flows through the second doped region 306, the third doped region 308 and finally to the ground terminal of the low voltage power site 320 such that the ESD current would not damage the main circuit. Since the transistor structure in the present invention further has the floating first doped region 304, which forms the parasitic diode 316 with the second doped region 306, the triggering voltage of the ggNMOS can be effectively lowered, and the sensitivity of the transistor for ESD protection can be upgraded.

Figure 5:
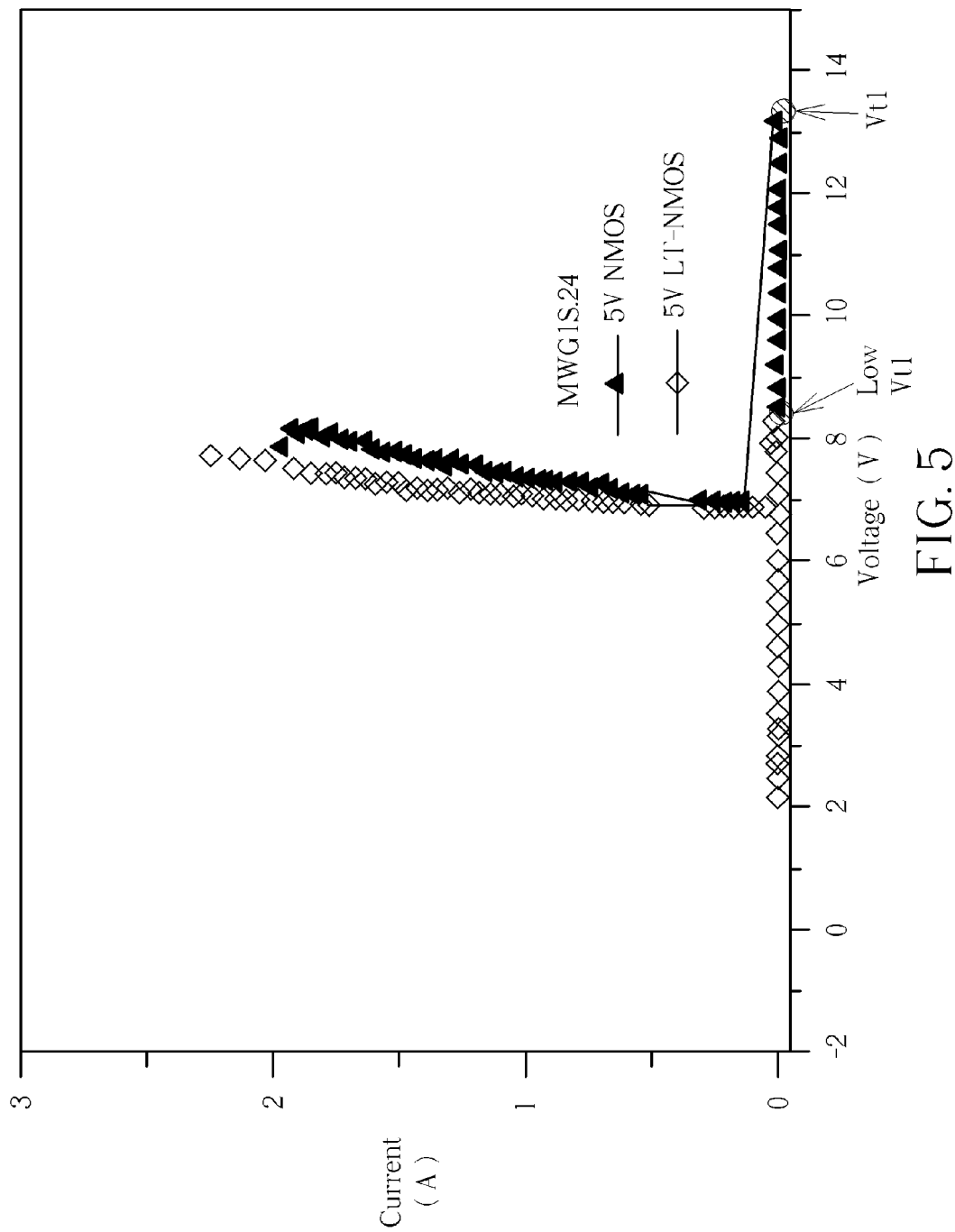
FIG. 5 shows a schematic diagram of the experimental results derived from the transistor structure for ESD protection.

Refer to FIG. 5, which shows a schematic diagram of the experimental results derived from the transistor structure for ESD protection, wherein the horizontal axis represents the voltage (unit: V), while the vertical axis represents the current (unit: A). The lines of the solid triangles indicates the transistor structure without the floating first doped region 304, while the lines of the hollow diamonds indicates the transistor structure with the floating first doped region 304. As clearly demonstrated in FIG. 5, the triggering voltage of the structure having the floating first doped region 304 is approximately 8.3 V, which is much smaller than the triggering voltage of the structure without the first doped region 304 (13.2 V). Accordingly, the transistor structure having the floating first doped region 304 can provide more sensitivity for the ESD protection. In another embodiment of the present invention, by further adjusting the gap L between the first doped region 304 and the second doped region 306, the triggering voltage can be modified, which can be even lowered to 1-8 V.

It is another salient feature of the present invention that the method for forming the first doped region 304 can be compatible with the existing CMOS fabrication method, and no additional mask should be formed. For example, the first doped region 304 and the fourth doped region 310 can have the same conductive type, such as P type, and the dopant concentrations of the two regions are the same. Consequently, the first doped region 304 and the fourth doped region 310 can be formed in the same ion implantation process. In comparison with one conventional art, which forms a doped region with lower dopant concentration by using additional mask so as to reduce the triggering voltage, the present invention can fully compatible with current process without the need for additional mask, so the costs can be saved.

Figure 6:
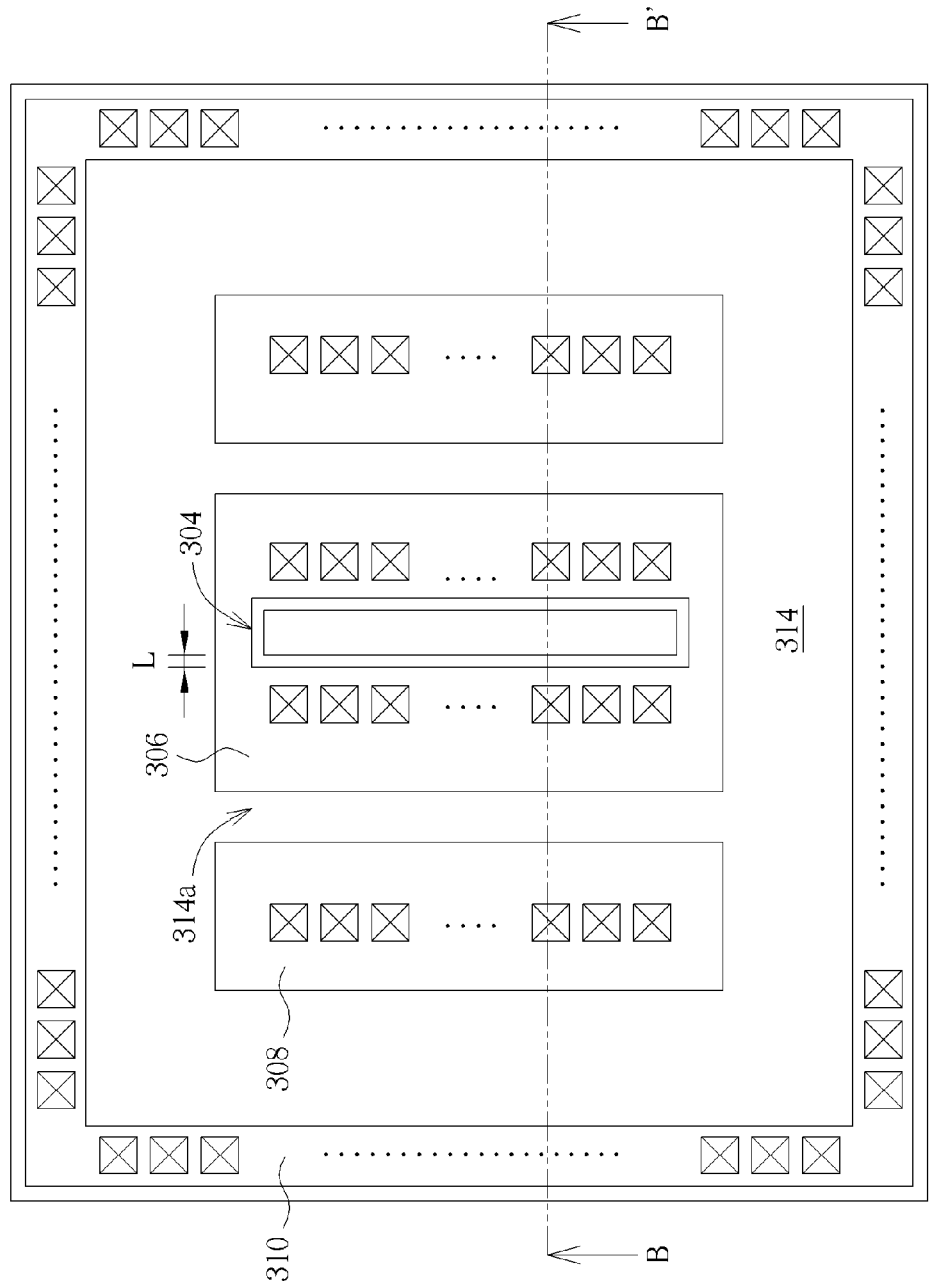
FIG. 6 to FIG. 8 show schematic diagrams of the transistor structure for ESD protection according to the second embodiment of the present invention.
Figure 7:
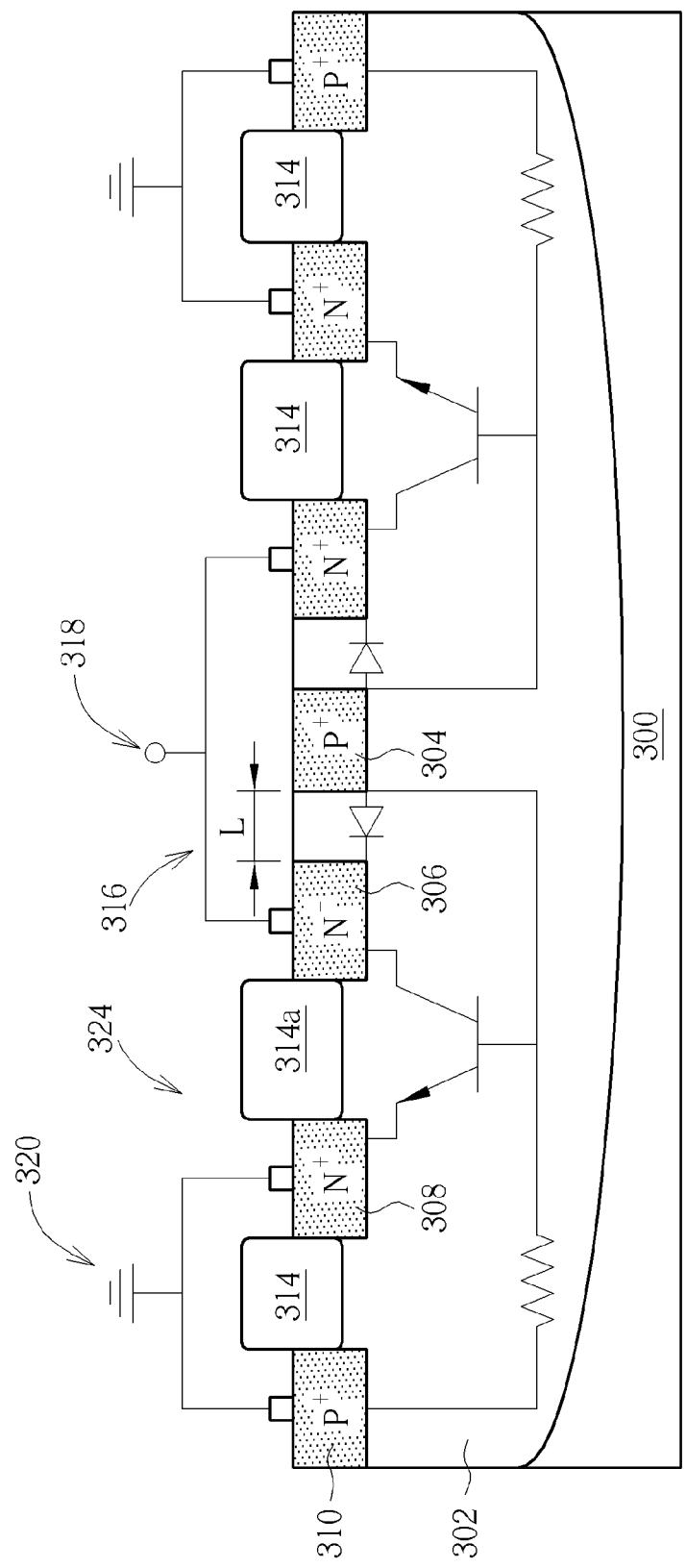
Figure 8:
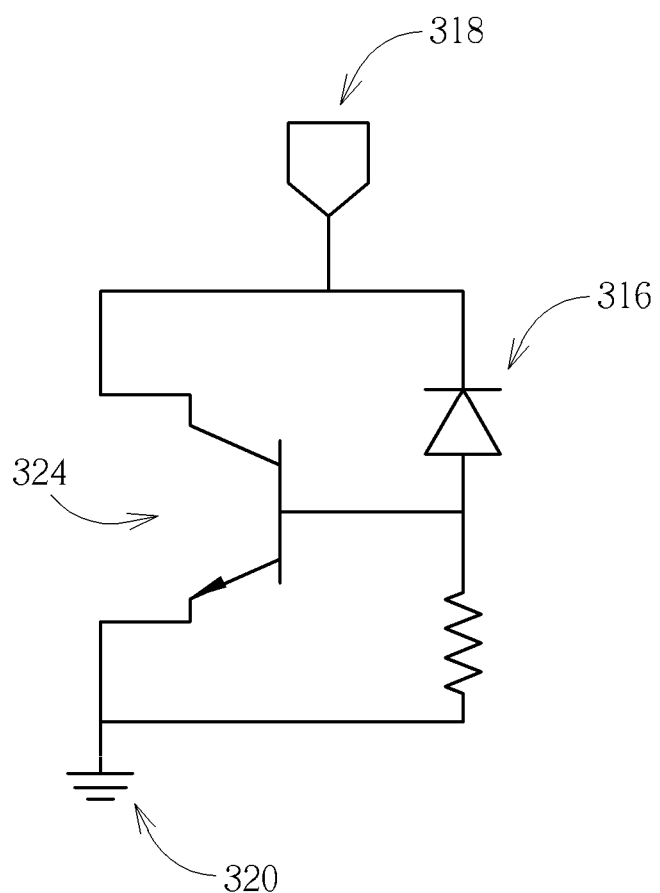

Please refer to FIG. 6 to FIG. 8, which show schematic diagrams of the transistor structure for ESD protection according to the second embodiment of the present invention, wherein FIG. 7 is a cross sectional view taken along line BB' in FIG. 6, and FIG. 8 is an equivalent circuit of the transistor structure in the present embodiment. The structure in the present embodiment is about similar to the previous embodiment. One different is that the previous embodiment is applied to the ggNMOS while the present embodiment is applied to a bipolar transistor (BJT). In detail, as shown in FIG. 6 and FIG. 7, an isolation structure 314*a* is disposed between the second doped region 306 and the third doped region 308 so the second doped region 306 and the third doped region 308 do not directly contact with each other. In one embodiment, the isolation structure 314*a* and the isolation structure 314 are formed in the same manufacturing process. In the present embodiment, the second doped region 306, the third doped region 308 and the doped well 302 together form the BJT 324, wherein the second doped region 306 serves as a collector, the third doped region 308 serves as a emitter and the doped well 302 serves as a base. The BJT 324 is able to provide function of ESD protection. By using the floating first doped region 304, the triggering voltage of the BJT 324 can be lowered as well.

Figure 9:
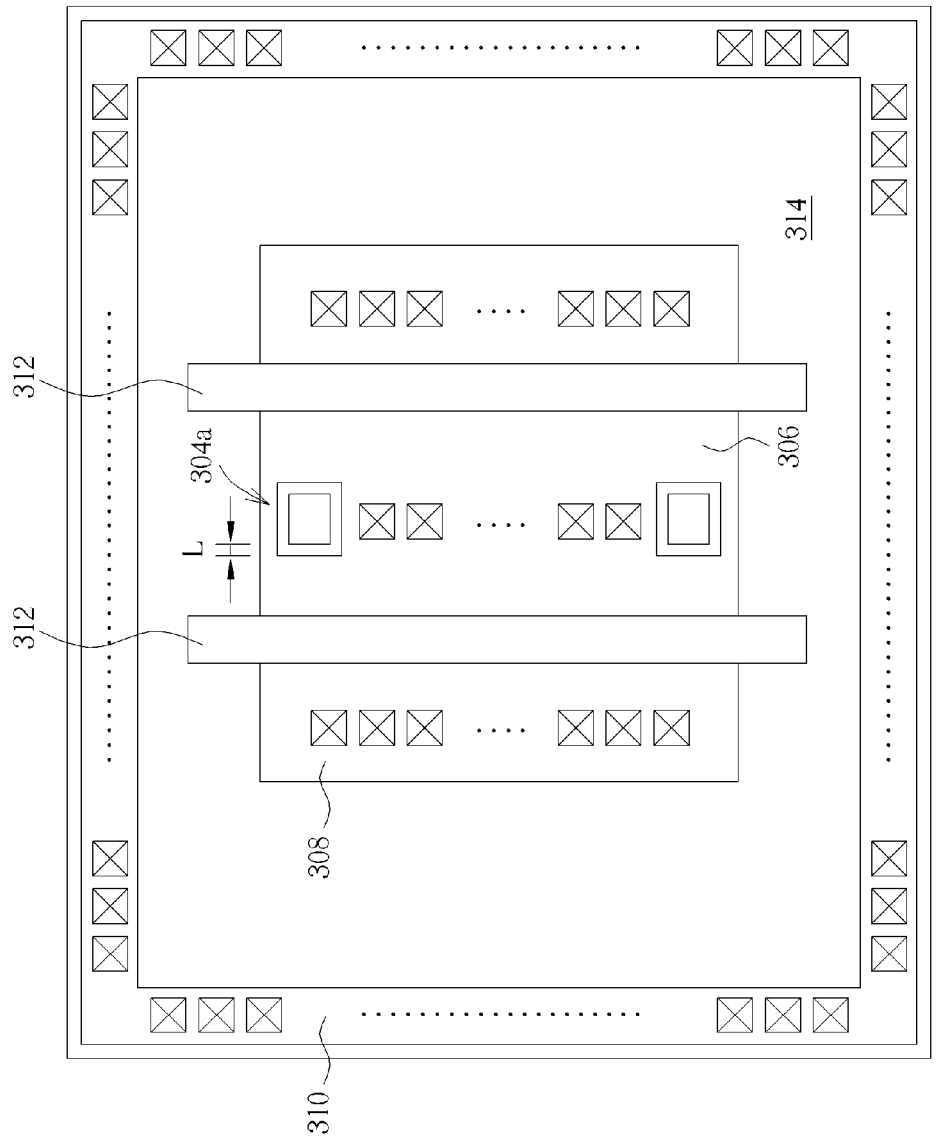
FIG. 9 shows a schematic diagram of the transistor structure for ESD protection according to another embodiment of the present invention.

Please refer to FIG. 9, which shows a schematic diagram of the transistor structure for ESD protection according to another embodiment of the present invention. As shown in FIG. 9, the first doped region 304 of the present embodiment may contain a plurality of sub first doped regions 304*a*, each of which is separated and encompassed by the doped well 302 and the second doped region 306 independently. A gap L is disposed between the second doped region 306 and each sub first doped region 304*a*. The sub first doped regions 304*a* can provide good ESD protection as well as the stripe-shaped first doped region 304 in the previous embodiment. It is noted that the semiconductor structure in FIG. 9 takes ggNMOS 322 for example, however, the sub first doped regions 304*a* can also be incorporated into the embodiment that includes BJT 324, as shown in FIG. 6.

In summary, the transistor structure set forth in the present invention has a parasitic diode, which is able to lower the triggering voltage of the transistor, thereby upgrading the sensitivity of the transistor for ESD protection. It is noted that the first conductive type and the second conductive type can be swapped in other embodiments. For example, the first conductive type can be N type and the second conductive type can be P type.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A transistor structure for electrostatic discharge (ESD) protection, comprising:
   a substrate;
   a single doped well disposed in the substrate, wherein the single doped well comprises a first conductive type dopant;
   a first doped region disposed in the substrate and encompassed by the single doped well, wherein the first doped region is floating and comprises the first conductive type dopant and a plurality of sub first doped regions;

a single second doped region disposed in the substrate and encompassed by the single doped well, wherein the single second doped region comprises a second conductive type dopant, each of the sub first doped regions is surrounded by the single second doped region and the single doped well from topview and a gap is disposed between the single second doped region and each of the sub first doped regions; and a third doped region disposed in the substrate and encompassed by the single doped well, wherein the third doped region comprises the second conductive type dopant.

2. The transistor structure for ESD protection as in claim 1, wherein each of the sub first doped regions and the single second doped region form a parasitic diode.

3. The transistor structure for ESD protection as in claim 1, wherein the single second doped region is electrically connected to a signal input.

4. The transistor structure for ESD protection as in claim 1, wherein the third doped region is connected to a low voltage power site.

5. The transistor structure for ESD protection as in claim 1, further comprising a gate disposed on the substrate between the single second doped region and the third doped region.

6. The transistor structure for ESD protection as in claim 5, wherein the gate is connected to a low voltage power site.

7. The transistor structure for ESD protection as in claim 5, wherein the gate, the single second doped region and the third doped region form a MOS.

8. The transistor structure for ESD protection as in claim 1, further comprising an isolation structure disposed in the substrate between the single second doped region and the third doped region.

9. The transistor structure for ESD protection as in claim 8, wherein the single second doped region, the third doped region and the single doped well form a bipolar transistor (BJT).

10. The transistor structure for ESD protection as in claim 1, further comprising a fourth doped region disposed in the substrate, and the third doped region and the fourth doped region are separated by an isolation structure.

11. The transistor structure for ESD protection as in claim 10, wherein the fourth doped region has the first conductive type dopant and a dopant concentration of the fourth doped region is substantially equal to that of the first doped region.

12. The transistor structure for ESD protection as in claim 10, wherein the fourth doped region is connected to a low voltage power site.

13. The transistor structure for ESD protection as in claim 1, wherein the first conductive type dopant is N type and the second conductive type dopant is P type.

14. The transistor structure for ESD protection as in claim 1, wherein the first conductive type dopant is P type and the second conductive type dopant is N type.

* * * * *